US007782057B2

(12) United States Patent
Okamoto et al.

(10) Patent No.: US 7,782,057 B2
(45) Date of Patent: Aug. 24, 2010

(54) ARRAY COIL AND MAGNETIC RESONANCE IMAGING APPARATUS

(75) Inventors: Kazuya Okamoto, Saitama (JP); Takahiro Ishihara, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 0 days.

(21) Appl. No.: 11/808,121

(22) Filed: Jun. 6, 2007

(65) Prior Publication Data
US 2007/0285199 A1 Dec. 13, 2007

(30) Foreign Application Priority Data
Jun. 7, 2006 (JP) .............................. 2006-158808

(51) Int. Cl.
*G01V 3/00* (2006.01)
(52) U.S. Cl. ....................................... 324/318; 324/322
(58) Field of Classification Search ................. 324/318, 324/322
See application file for complete search history.

(56) References Cited

U.S. PATENT DOCUMENTS

| 6,157,280 | A | * | 12/2000 | Arz et al. .................... 335/299 |
| 6,879,159 | B2 | * | 4/2005 | Yoshida ...................... 324/318 |
| 6,930,481 | B2 | | 8/2005 | Okamoto et al. |
| 7,026,818 | B2 | | 4/2006 | Machida et al. |
| 7,141,980 | B2 | * | 11/2006 | Belt et al. .................... 324/322 |

FOREIGN PATENT DOCUMENTS

| JP | 03-32645 | 2/1991 |
| JP | 04-212329 | 8/1992 |
| JP | 2002-3290168 | 10/2003 |

* cited by examiner

*Primary Examiner*—Louis M Arana
(74) *Attorney, Agent, or Firm*—Nixon & Vanderhye PC

(57) ABSTRACT

An array coil including at least three conductive elements arranged at predetermined intervals, each of the conductive elements being in the form of a loop, and a plurality of switches that enable the conductive elements to be connected together according to a plurality of connecting patterns.

22 Claims, 10 Drawing Sheets

|  |  | j1-j2 | | | | | | | |
|---|---|---|---|---|---|---|---|---|---|
|  |  | 1 | 2 | 3 | 4 | 5 | 6 | 7 | 8 |
| j2 | 0 | ch1 | ch1 | ch1, 2 | ch1, 2 | ch1~3 | ch1~3 | ch1~4 | ch1~4 |
|  | 1 | ch1 |  | ch1, 2 |  | ch1~3 |  | ch1~4 |  |
|  | 2 | ch2 | ch2 | ch2~3 | ch2~3 | ch2~4 | ch2~4 |  |  |
|  | 3 | ch2 |  | ch2~3 |  | ch2~4 |  |  |  |
|  | 4 | ch3 | ch3 | ch3~4 | ch3~4 |  |  |  |  |
|  | 5 | ch3 |  | ch3~4 |  |  |  |  |  |
|  | 6 | ch4 | ch4 |  |  |  |  |  |  |
|  | 7 | ch4 |  |  |  |  |  |  |  |

FIG. 6

|  |  | j1-j2 | | | | | | | |
|---|---|---|---|---|---|---|---|---|---|
|  |  | 1 | 2 | 3 | 4 | 5 | 6 | 7 | 8 |
| j2 | 1 | ch1 | ch1 | ch1, 2 | ch1, 2 | ch1~3 | ch1~3 | ch1~4 | ch1~4 |
|  | 2 | ch1 |  | ch1, 2 |  | ch1~3 |  | ch1~4 |  |
|  | 3 | ch2 | ch2 | ch2~3 | ch2~3 | ch2~4 | ch2~4 |  |  |
|  | 4 | ch2 |  | ch2~3 |  | ch2~4 |  |  |  |
|  | 5 | ch3 | ch3 | ch3~4 | ch3~4 |  |  |  |  |
|  | 6 | ch3 |  | ch3~4 |  |  |  |  |  |
|  | 7 | ch4 | ch4 |  |  |  |  |  |  |
|  | 8 | ch4 |  |  |  |  |  |  |  |

FIG. 7

ARRAY COIL AND MAGNETIC RESONANCE IMAGING APPARATUS

CROSS-REFERENCE TO RELATED APPLICATIONS

This application is based upon and claims the benefit of priority from prior Japanese Patent Application No. 2006-158808, filed Jun. 7, 2006, the entire contents of which are incorporated herein by reference.

BACKGROUND OF THE INVENTION

1. Field of the Invention

The present invention relates to an array coil suitably used as the receiving RF coil of a magnetic resonance imaging apparatus. The present invention also relates to a magnetic resonance imaging apparatus provided with the array coil.

2. Description of the Related Art

Array coils are in wide use as receiving radio frequency (RF) coils of magnetic resonance imaging apparatuses (MRI apparatuses). An array coil is made by arranging a plurality of element coils.

Known array coils include a type provided with a large number of element coils and enabling a wide imaging region. When this type of array coil is put to use, the field of view (FOV) may be narrower than the sensitivity region of the entire array coil. In this case, the element coils are partially made effective in such a manner that the size of the actual sensitivity region corresponds to the size of the FOV.

Jpn. Pat. Appln. KOKAI Publication No. 4-212329 discloses a magnetic resonance imaging apparatus related to the above technology. In the magnetic resonance imaging apparatus of the publication, only the coil assemblies that are used for imaging are selected and made effective.

Where the sensitivity region required in accordance with the FOV (the sensitivity region will be hereinafter referred to as the "required sensitivity region") is attained by part of the element coils, the element coils that are made effective are selected from all element coils of the array coil. Then, each of the required sensitivity regions has to overlap each of the sensitivity regions of the selected element coils (which will be hereinafter referred to as "individual sensitivity regions"). Depending upon the positional relationships between the FOV and each element coil, therefore, the number of element coils that have to be selected may be larger than the minimal number of element coils required for forming the actual sensitivity region having the same size as the FOV. Since, in this case, the sensitivity region is larger than the FOV, aliasing artifact may occur.

As a method for reducing the number of selected element coils to a value approximately equal to the above-mentioned minimal number, it is thought to employ element coils whose width is decreased with respect to the arrangement direction of the element coils. It is also thought to widen the overlap portion between the adjacent element coils. However, the former method has problems in that the sensitivity is degraded in regions away from the array coil. Likewise, the latter method has problems in that the interference between the element coils is so intense that the SN ratio is degraded.

BRIEF SUMMARY OF THE INVENTION

Under the circumstances, there has been a demand for providing a high degree of freedom when the sensitivity region is determined or adjusted, without relying on the conventional methods described above.

According to a first aspect of the present invention, there is provided an array coil comprising: at least three conductive elements arranged at predetermined intervals, each of the conductive elements being in the form of a loop; and a plurality of switches that enable the conductive elements to be connected together according to a plurality of connecting patterns.

According to a second aspect of the present invention, there is provided an array coil comprising: n conductive elements, wherein one element coil is formed by arranging m of the n conductive elements, m being an integer greater than one, and n being an integer greater than m; and a unit configured to connect the conductive elements according to one of a plurality of connecting patterns, each of the connecting patterns being determined such that at least one element coil is formed.

According to a third aspect of the present invention, there is provided a magnetic resonance imaging apparatus comprising: an array coil including (i) at least three conductive elements arranged at predetermined intervals, each of the conductive elements being in the form of a loop; and (ii) a plurality of switches that enable the conductive elements to be connected together according to a plurality of connecting patterns; a pattern selecting unit configured to select one of the connecting patterns; a control unit configured to control the switches such that the conductive elements are connected together according to a connecting pattern selected by the pattern selecting unit; and a reconstruction unit configured to reconstruct an image of a subject on the basis of signals which a conductive element group outputs in response to magnetic resonance signals radiating from the subject, the conductive element group being constituted by those conductive elements which are connected together according to the connecting pattern selected by the pattern selecting unit.

According to a fourth aspect of the present invention, there is provided a magnetic resonance imaging apparatus comprising: an array coil including (i) coil groups in each of which element coils for receiving the magnetic resonance signals are arranged while being shifted from each other, and (2) an effective coil group-providing unit configured to selectively make coil groups effective; a coil group selecting unit configured to select one coil group of the coil groups on the basis of positional relationships between an imaging region and the coil groups; a control unit configured to control the effective coil group-providing unit such that the coil group selected by the coil group selecting unit is made effective; and a reconstruction unit configured to reconstruct an image of a subject on the basis of signals which at least one element coil outputs in response to magnetic resonance signals radiating from the subject, said at least one element coil being included among the element coils of the coil groups made effective by the effective coil group-providing unit.

According to a fifth aspect of the present invention, there is provided a magnetic resonance imaging apparatus comprising: an array coil including (i) n conductive elements, wherein one element coil is formed by arranging m of the n conductive elements, m being an integer greater than one, and n being an integer greater than m, and a connecting unit configured to connect the conductive elements according to one of a plurality of connecting patterns, each of the connecting patterns being determined such that at least one element coil is formed; and a reconstruction unit configured to reconstruct an image of a subject on the basis of signals which at least one element coil outputs in response to magnetic resonance signals radiating from the subject, said at least one element coil being included among the element coils of coil groups formed by connecting the m conductive elements.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 shows an example of a first setting table used for selecting an effective channel in the first mode.

FIG. 7 shows an example of a second setting table used for selecting an effective channel in the second mode.

DETAILED DESCRIPTION OF THE INVENTION

An embodiment of the invention will be described with reference to the accompanying drawings.

Figure 1:
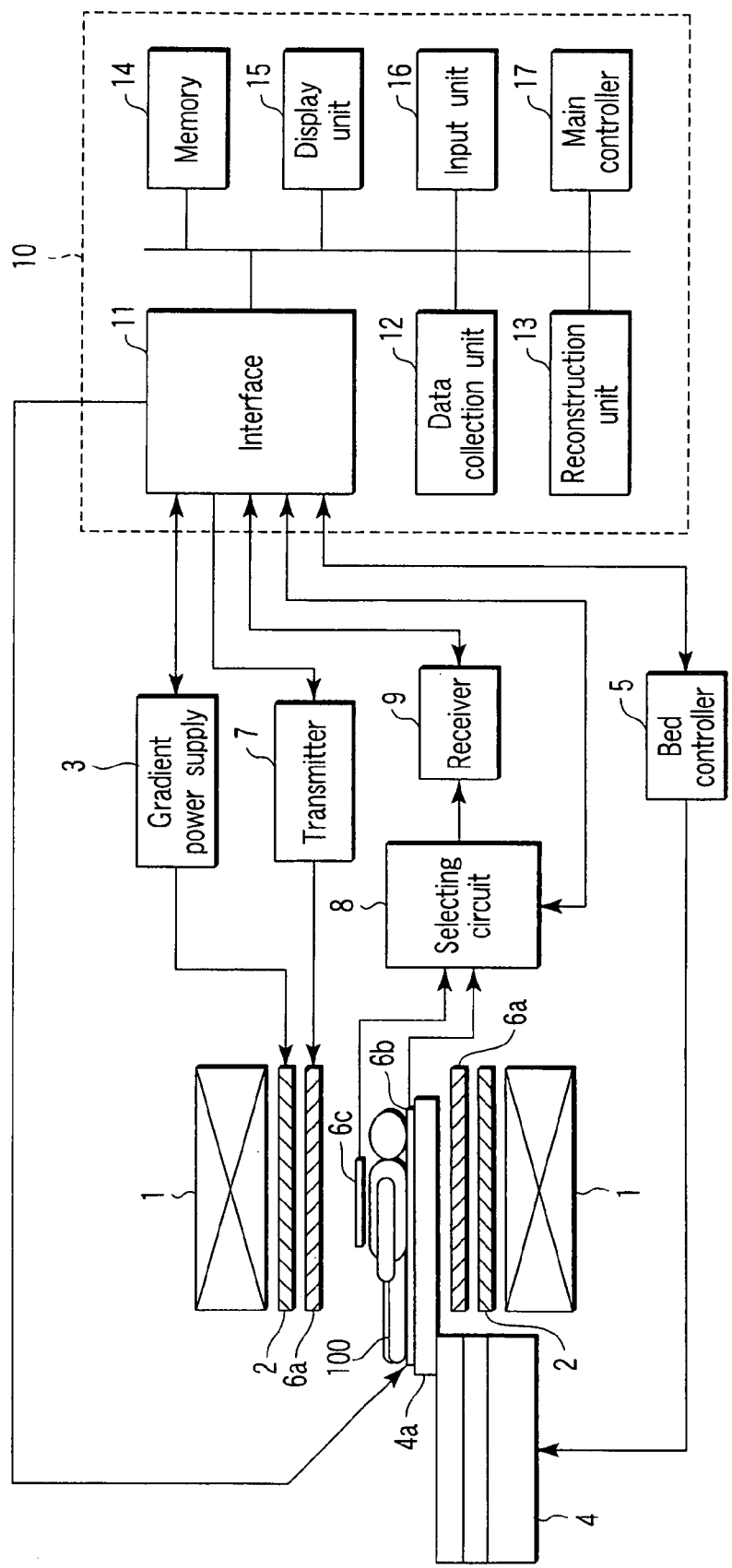
FIG. 1 shows a configuration of a magnetic resonance imaging apparatus (MRI apparatus) according to an embodiment of the present invention.

FIG. 1 is a block diagram illustrating the configuration of a magnetic resonance imaging apparatus (MRI apparatus) according to the embodiment. The MRI apparatus of FIG. 1 comprises a static field magnet 1, a gradient coil 2, a gradient power supply 3, a bed 4, a bed controller 5, RF coil units 6a, 6b and 6c, a transmitter 7, a selecting circuit 8, a receiver 9 and a computer system 10.

The static field magnet 1 is a hollow cylindrical member, and generates a uniform static magnetic field. The static field magnet 1 is, for example, a permanent magnet or a superconducting magnet.

The gradient coil 2 is also a hollow cylindrical member located inside the static field magnet 1. The gradient coil 2 is formed of three coils corresponding to three axes X, Y and Z perpendicular to each other. In the gradient coil 2, the three coils are individually supplied with a current from a gradient power supply 3, thereby generating gradient magnetic fields having their magnetic field intensities varied along the X, Y and Z axes. Assume here that the Z-axis direction corresponds to, for example, the magnetization direction of the static magnetic field. The gradient magnetic fields along the X, Y and Z axes correspond to, for example, a slice-selecting gradient magnetic field Gs, a phase-encoding gradient magnetic field Ge and a readout gradient magnetic field Gr, respectively. The slice-selecting gradient magnetic field Gs is used to determine an arbitrary imaging section. The phase-encoding gradient magnetic field Ge is used to change the phase of a magnetic resonance signal in accordance with its spatial position. The readout gradient magnetic field Gr is used to change the frequency of a magnetic resonance signal in accordance with its spatial position.

A subject 100 placed on a top table 4a of the bed 4 is inserted into the cavity (imaging space) of the gradient coil 2 along with the bed 4. The top table 4a of the bed 4 is longitudinally and vertically driven by the bed controller 5. Normally, the bed 4 is positioned with its longitudinal direction set parallel to the axis of the static field magnet 1.

RF coil unit 6a is made by arranging one or a plurality of coils in a cylindrical case. RF coil unit 6a is located inside the gradient coil 2, and is used to generate a high-frequency magnetic field upon receiving a high-frequency pulse signal from the transmitter 7.

RF coil units 6b and 6c are mounted on the top table 4a, built in the top table 4a, or attached to the subject 100. When imaging is performed, they are inserted into the imaging space along with the subject 100. Array coils are used as RF coil units 6b and 6c. Each of RF coil units 6b and 6c includes a plurality of element coils. The element coils of RF coil units 6b and 6c receive magnetic resonance signals radiating from the subject 100. Output signals from each element coil are supplied to the selecting circuit 8. The RF coil units for signal reception are not limited to the RF coil units 6b and 6c described above, and various types of RF coil units may be used for signal reception. In addition, the RF coil units are not limited to two in number. A single RF coil unit may be used; alternatively, three or more RF coil units may be used.

The transmitter 7 transmits a high-frequency pulse signal corresponding to the Larmor frequency to RF coil unit 6a.

The selecting circuit 8 selects signals from a large number of magnetic resonance signals output from RF coil units 6a and 6c. The selecting circuit 8 supplies the selected magnetic resonance signals to the receiver 9. The computer system 10 designates which channel should be selected at a given time.

The receiver 9 includes processing systems corresponding to a plurality of channels, and each processing system includes an amplifier unit, a phase detection unit and an analog/digital converter unit. Magnetic resonance signals selected by the selecting circuit 8 are supplied to the plural-channel processing systems. The amplifier unit amplifies magnetic resonance signals. The phase detection unit detects the phase of a magnetic resonance signal output from the amplifier unit. The analog/digital converter unit converts a signal output from the phase detection unit to a digital signal. The receiver 9 outputs digital signals produced from each processing system.

The computer system 10 includes an interface 11, a data collection unit 12, a reconstruction unit 13, a memory 14, a display unit 15, an input unit 16 and a main controller 17.

The interface 11 is connected to the gradient power supply 3, bed controller 5, RF coil unit 6b, transmitter 7, receiver 9, selecting circuit 8, etc. The interface 11 permits signals to be exchanged between the structural components described above and the computer system 10.

The data collection unit 12 collects digital signals output from the receiver 9. The data collection unit 12 stores the collected digital signals (i.e., magnetic resonance signal data) in the memory 14.

The reconstruction unit 13 performs post-processing such as Fourier transform on the magnetic resonance signal data stored in the memory 14, thereby acquiring spectrum data or image data corresponding to a desired nuclear spin in the subject 100.

The memory 14 stores the magnetic resonance signal data and spectrum data or image data of each subject.

The display unit 15 displays various information items, such as spectrum data, image data, etc., under the control of the controller 17. The display unit 15 may be a liquid crystal display, for example.

The input unit 16 receives various instructions or information items input by an operator. The input unit 16 may be a pointing device (such as a mouse or a track ball), a selective device (such as a mode switch), or an input device (such as a keyboard).

The main controller 17 includes a CPU, a memory, etc., and controls the entire MRI apparatus of the embodiment. In addition to the functions for realizing known operations of the MRI apparatus, the main controller 17 has two functions. One of the two functions is to automatically select an operation mode of RF coil unit 6b, and the other is to automatically select an element coil that should be made effective, from among the element coils of RF coil unit 6b.

The configuration of the MRI apparatus of the embodiment has been described. The embodiment is featured by the array coils used as RF coil units 6b and 6c. Therefore, a detailed description will be given of the array coils used as RF coil units 6b and 6c.

First Embodiment

Figure 2:
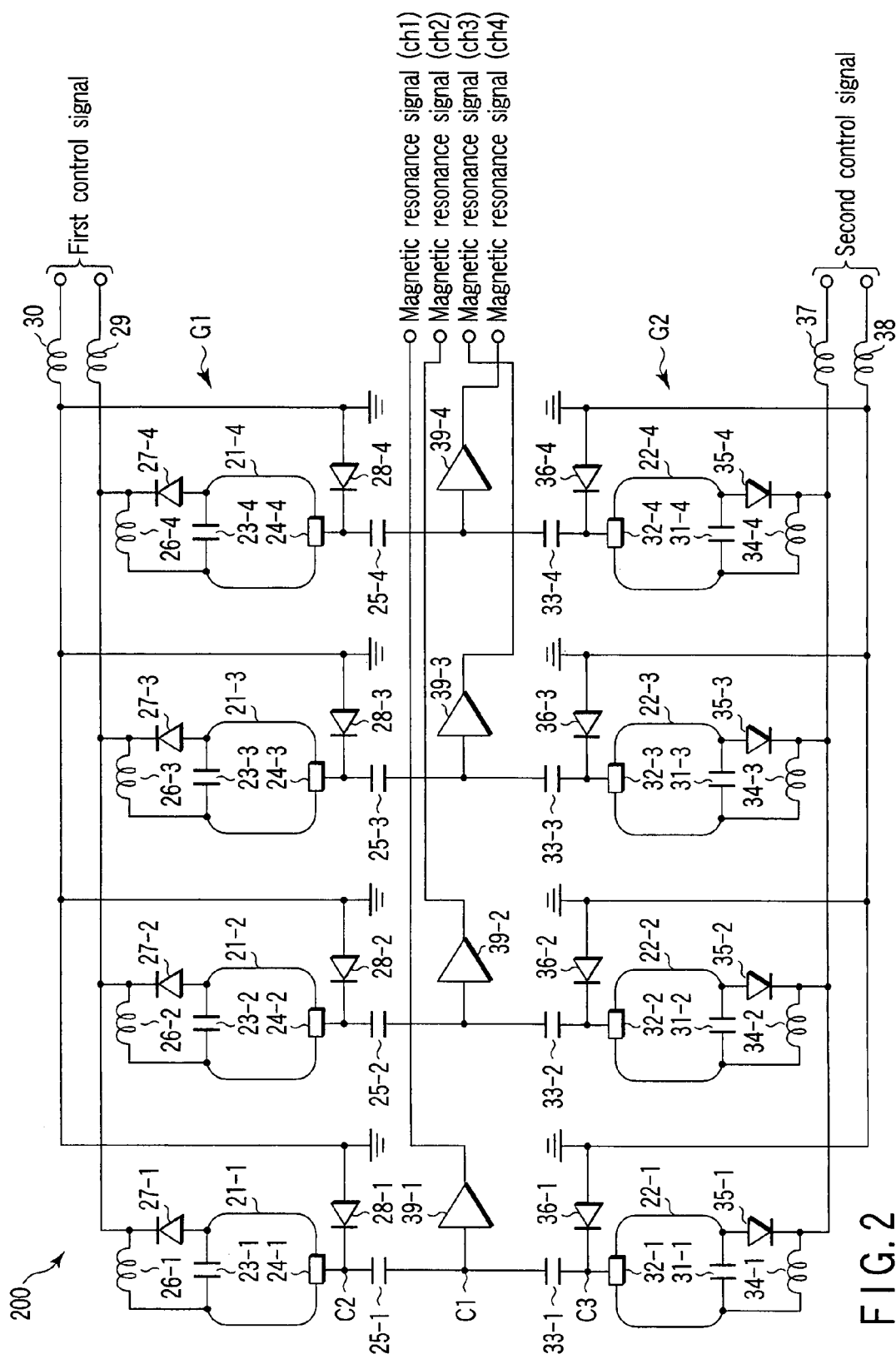
FIG. 2 is a circuit diagram of an array coil used in the first embodiment.

FIG. 2 shows a circuit configuration of an array coil 200 used in the first embodiment.

The array coil 200 comprises two coil groups G1 and G2. Coil group G1 includes four element coils 21-1, 21-2, 21-3 and 21-4, and coil group G2 includes four element coils 22-1, 22-2, 22-3 and 22-4.

In addition, the array coil 200 comprises: capacitors 23-1, 23-2, 23-3 and 23-4; matching circuits 24-1, 24-2, 24-3 and 24-4; capacitors 25-1, 25-2, 25-3 and 25-4; coils 26-1, 26-2, 26-3 and 26-4; PIN diodes 27-1, 27-2, 27-3, 27-4, 28-1, 28-2, 28-3 and 28-4; choke coils 29 and 30; capacitors 31-1, 31-2, 31-3 and 31-4; matching circuits 32-1, 32-2, 32-3 and 32-4; capacitors 33-1, 33-2, 33-3 and 33-4; coils 34-1, 34-2, 34-3 and 34-4; PIN diodes 35-1, 35-2, 35-3, 35-4, 36-1, 36-2, 36-3 and 36-4; choke coils 37 and 38; and preamplifier 39-1, 39-2, 39-3 and 39-4.

Among capacitors 23-1 to 23-4, matching circuits 24-1 to 24-4, capacitors 25-1 to 25-4, coils 26-1 to 26-4 and PIN diodes 27-1 to 27-4 and 28-1 to 28-4, those elements denoted by suffix "-1" are provided for element coil 21-1, those elements denoted by suffix "-2" are provided for element coil 21-2, those elements denoted by suffix "-3" are provided for element coil 21-3, and those elements denoted by suffix "-4" are provided for element coil 21-4. Among capacitors 31-1 to 31-4, matching circuits 32-1 to 32-4, capacitors 33-1 to 33-4, coils 34-1 to 34-4 and PIN diodes 35-1 to 35-4 and 36-1 to 36-4, those elements denoted by suffix "-1" are provided for element coil 22-1, those elements denoted by suffix "-2" are provided for element coil 22-2, those elements denoted by suffix "-3" are provided for element coil 22-3, and those elements denoted by suffix "-4" are provided for element coil 22-4.

Element coil 21-1 receives a magnetic resonance signal. The magnetic resonance signal received by element coil 21-1 is supplied to preamplifier 39-1 after passing through matching circuit 24-1 and capacitor 25-1. Matching circuit 24-1 performs impedance matching between element coil 21-1 and preamplifier 39-1. Capacitor 25-1 serves to remove DC components from the signals supplied to preamplifier 39-1.

Capacitor 23-1 is inserted in element coil 21-1. One end of coil 26-1 is connected to the cathode of PIN diode 27-1. Coil 26-1 and PIN diode 27-1 are connected in parallel with capacitor 23-1. One end of choke coil 29 is connected to the connection node between coil 26-1 and PIN diode 27-1. The cathode of PIN diode 28-1 is connected to the connection node between matching circuit 24-1 and capacitor 25-1. The anode of PIN diode 28-1 is grounded and is also connected to one end of choke coil 30. A first control signal from the computer system 10 is applied between the other ends of choke coils 29 and 30. The signal line connected to choke coil 30 is grounded. In addition, the computer system 10 controls the potential of the signal line connected to choke coil 29 to be positive or negative, thereby supplying positive bias or negative bias to array coil 200 as the first control signal.

As can be understood from FIG. 2, the circuits related to elements 21-2 to 21-4 are similar in configuration to the above-mentioned circuit related to element coil 21-1. Capacitors 25-2, 25-3 and 25-4 are connected to preamplifier 39-2, 39-3 and 39-4, respectively. That is, magnetic resonance signals received by element coils 21-2 to 21-4 are supplied to preamplifier 39-2 to 39-4, respectively. Choke coil 29 is connected to the connection node between coil 26-2 and PIN diode 27-2, the connection node between coil 26-3 and PIN diode 27-3, and the connection node between coil 26-4 and PIN diode 27-4. The anodes of PIN diodes 28-2, 28-3 and 28-4 are grounded, and are also connected to choke coil 30.

The circuit related to element coil 22-1 (which is formed by capacitor 31-1, matching circuit 32-1, capacitor 33-1, coil 34-1 and PIN diode 35-1 and 36-1) is similar in configuration to the circuit related to element coil 21-1. Likewise, the circuits related to element coils 22-2 to 22-4 are similar in configuration to the circuit related to element coil 22-1. Capacitors 33-1 to 33-4 are connected to preamplifier 39-1 to 39-4, respectively. Magnetic resonance signals received by element coils 22-2 to 22-4 are supplied to preamplifiers 39-2 to 39-4, respectively. One end of choke coil 37 is connected to the connection node between coil 34-1 and PIN diode 35-1, the connection node between coil 34-2 and PIN diode 35-2, the connection node between coil 34-3 and PIN diode 35-3, and the connection node between coil 34-4 and PIN diode 35-4. The anodes of PIN diodes 36-1 to 36-4 are grounded, and are also connected to one end of choke coil 38.

The computer system 10 applies a second control signal between the other ends of choke coils 37 and 38. The signal line connected to choke coil 38 is grounded. In addition, the computer system 10 controls the potential of the signal line connected to choke coil 37 to be positive or negative, thereby supplying positive bias or negative bias to array coil 200 as the second control signal.

As can be seen from the above, capacitors 25-1 and 33-1 are connected to the input terminal of preamplifier 39-1. The length of the transmission line between connection point C1 (where preamplifier 39-1, capacitor 25-1 and capacitor 33-1 are connected together) and connection point C2 (where capacitor 25-1 and diode 28-1 are connected together) should desirably be $\lambda/4+(\lambda/2)\times r$ (r_being an integer). Also, the length of the transmission line between connection point C1 and connection point C3 (where capacitor 33-1 and diode 36-1 are connected together) should desirably be $\lambda/4+(\lambda/2)\times r$. This holds true for the input terminals of preamplifiers 39-2 to 39-4. Symbol $\lambda$ denotes a wavelength of a magnetic resonance signal.

Preamplifiers 39-1 to 39-4 amplify signals supplied to their input terminals and output the amplified signals. The outputs of preamplifiers 39-1 to 39-4 are supplied to the selecting circuit 8 as magnetic resonance signals of first channel (ch1) to fourth channel (ch4).

Figure 3:
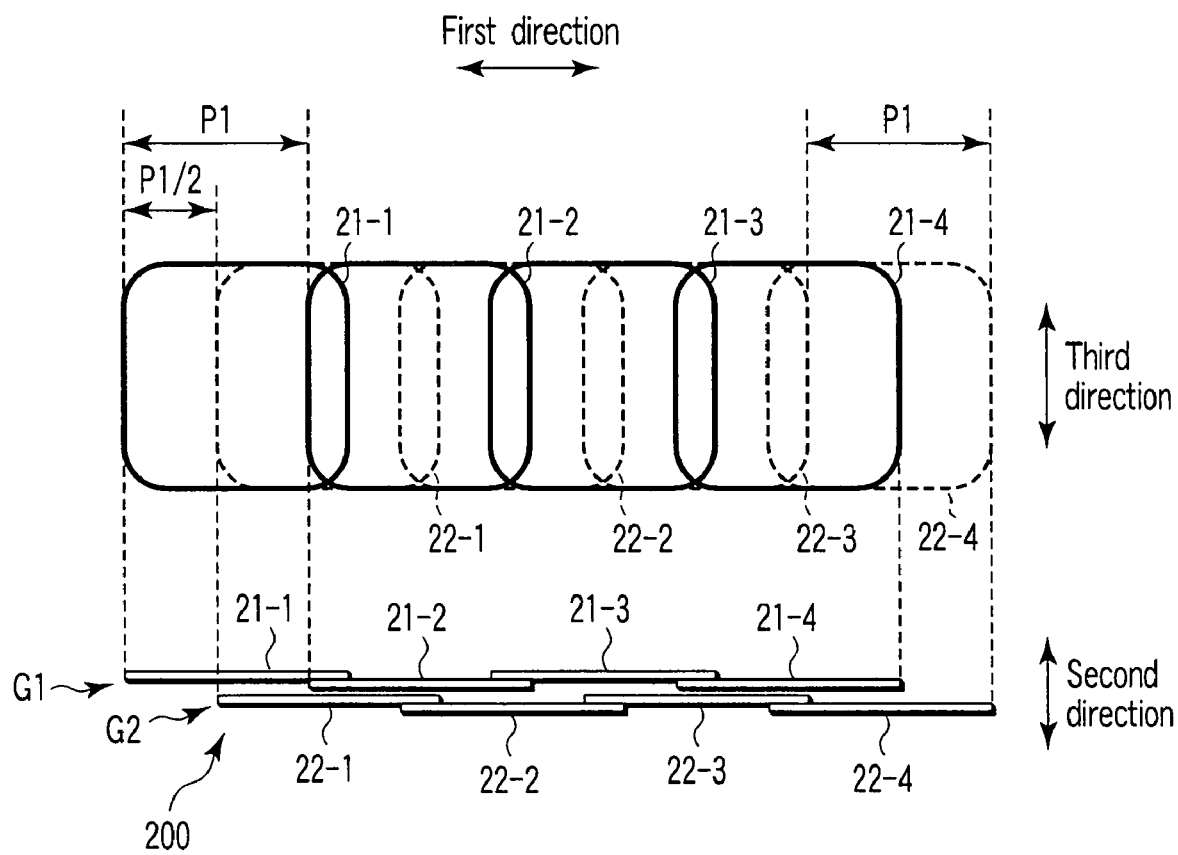
FIG. 3 schematically shows how the element coils shown in FIG. 2 are arranged.

FIG. 3 schematically shows how the element coils 21-1 to 21-4 and 22-1 to 22-4 are arranged. The upper portion of FIG. 3 is a plan view, and the lower portion thereof is a side view. In the plan view, element coils 22-1 to 22-4 are indicated by broken lines so as to clearly show the positional differences between element coils 21-1 to 21-4 and element coils 22-1 to 22-4.

Element coils 21-1 to 21-4 are arranged in a first direction at predetermined intervals P1. The end portions of the adjacent ones of element coils 21-1 to 21-4 overlap each other. Likewise, element coils 22-1 to 22-4 are arranged in the first direction at predetermined intervals P1. The end portions of the adjacent ones of element coils 22-1 to 22-4 overlap each other. With this arrangement, coil groups G1 and G2 are formed. Coil groups G1 and G2 are arranged along the second direction that is perpendicular to the first direction. With respect to the third direction that is perpendicular to both the first and second directions, coil groups G1 and G2 correspond in position. With respect to the first direction, the position of coil group G1 and the position of coil group G2 differ from each other. Coil groups G1 and G2 are shifted from each other by one half of interval P1. With this structure, element coils 21-1 to 21-4 and element coils 22-1 to 22-4 do not face each other. It should be noted that the arrangement directions and positions of element coils 21-1 to 21-4 and 22-1 to 22-4 do not have to strictly satisfy the above-mentioned conditions. They may be arranged in a different way from that mentioned above.

A description will now be given of an operation of the array coil 200 having the above structure.

When positive bias is received as the first control signal, PIN diodes 27-1 to 27-4 and 28-1 to 28-4 are applied with reverse bias and are therefore in the OFF state. As a result, element coils 21-1 to 21-4 can receive magnetic resonance signals.

When negative bias is received as the first control signal, PIN diodes 27-1 to 27-4 and 28-1 to 28-4 are applied with forward bias and are therefore in the ON state. As a result, element coils 21-1 to 21-4 cannot receive magnetic resonance signals.

When positive bias is received as the second control signal, PIN diodes 35-1 to 35-4 and 36-1 to 36-4 are applied with reverse bias and are therefore in the OFF state. As a result, element coils 22-1 to 22-4 can receive magnetic resonance signals.

When negative bias is received as the second control signal, PIN diodes 35-1 to 35-4 and 36-1 to 36-4 are applied with forward bias and are therefore in the ON state. As a result, element coils 22-1 to 22-4 cannot receive magnetic resonance signals.

As can be seen from the above, when positive bias is input as the first control signal and negative bias is input as the second control signal, coil group G1 is made effective. Conversely, when negative bias is input as the first control signal and positive bias is input as the second control signal, coil group G2 is made effective. Only the magnetic resonance signals received by the element coils contained in the effective coil group are supplied to preamplifiers 39-1 to 39-4. Let us assume that the selecting circuit 8 selects all element coils of each of the coil groups G1 and G2. In this case, the position of the actual sensitivity region provided when coil group G1 is made effective and the position of the actual sensitivity region provided when coil group G2 is made effective, are shifted from each other by P1/2. This means that the position of the actual sensitivity region can be varied by a distance shorter than the distance at which the element coils in one coil group are arranged.

The user can select a mode between the first mode (in which coil group G1 is made effective) and the second mode (in which coil group G2 is made effective). Moreover, the user can select a channel that should be made effective, from among the four channels through which magnetic resonance signals from preamplifiers 39-1 to 39-4 are supplied. In this case, the main controller 17 makes coil group G1 effective when the user designates the first mode by use of the input unit 16, and makes coil group G2 effective when the user designates the second mode. In addition, the main controller 17 controls the selecting circuit 8 to select magnetic resonance signals of the effective channel which the user designates by use of the input unit 16. It should be noted, however, that the main controller 17 can select a mode and an effective channel automatically, as will be described below.

Figure 4:
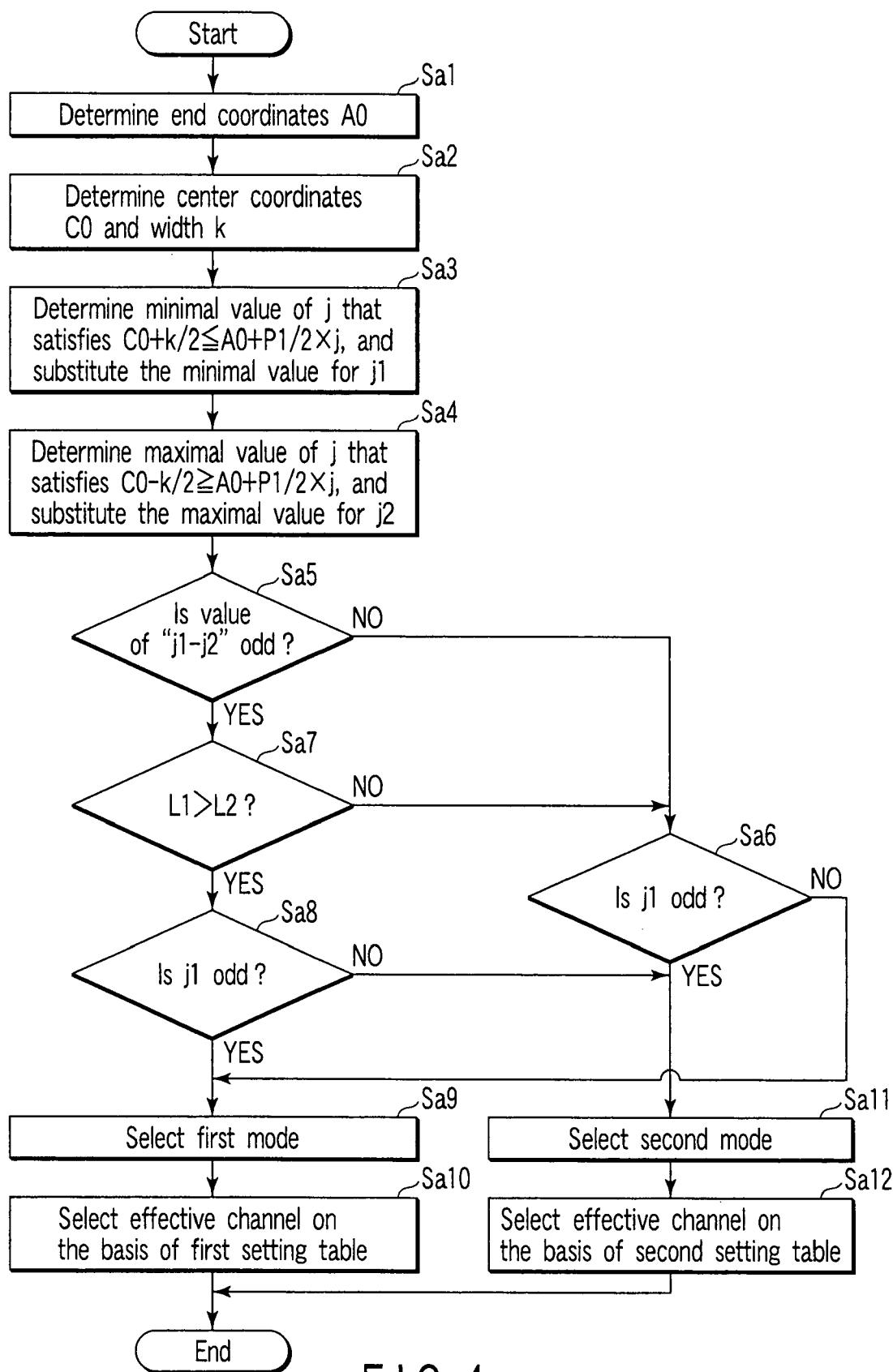
FIG. 4 is a flowchart illustrating the processing the main controller shown in FIG. 1 performs.

FIG. 4 is a flowchart illustrating the processing the main controller 17 performs.

The coordinates referred to in the description given below are those of a one-dimensional coordinate system in which one end of the top table 4a is used as a reference point and which extends in the Z-axis direction.

Figure 5:
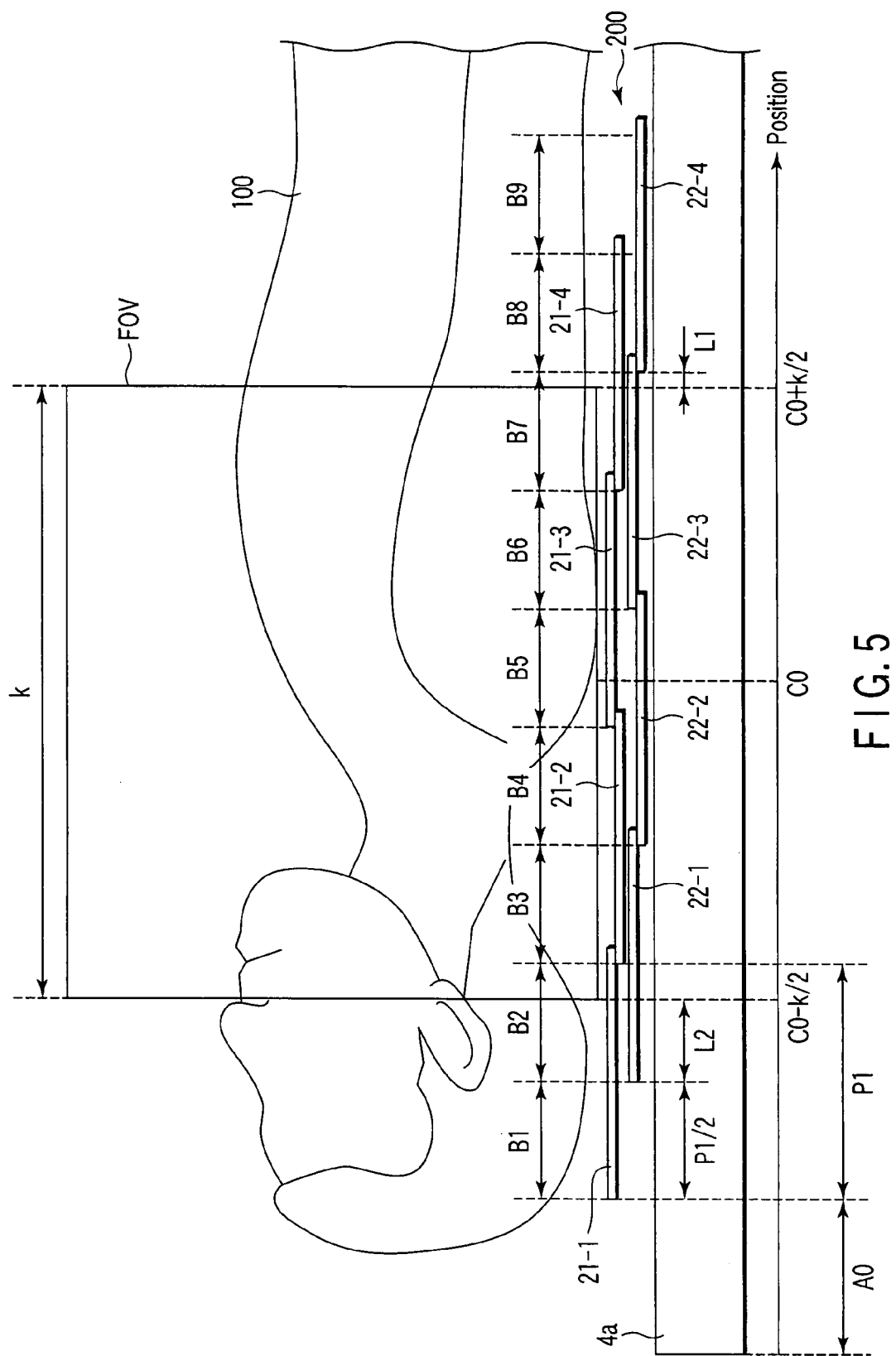
FIG. 5 shows an example of a position where on a top table the array coil shown in FIG. 2 is provided.

In step Sa1, the main controller 17 determines end coordinates A0. The end coordinates A0 are coordinates at which element coil 21-1 is located, as shown in FIG. 5. The end coordinates A0 may be entered by the user; alternatively, it may be determined based on the position where the array coil 200 is arranged on the top table 4a. The position where the array coil 200 is arranged on the top table 4a may be detected by a sensor provided on the top table 4a; alternatively, it may be detected based on signals element coils 21-1 to 21-4 and 22-1 to 22-4 receive.

In step Sa2, the main controller 17 determines center coordinates C0 of the FOV and width k of the FOV as measured in the Z-axis direction. The FOV is determined in a known way on the basis of the imaging conditions the user designates.

In step Sa3, the main controller 17 determines the minimal value of j that satisfies the formula (1) below and substitutes the minimal value for variable j1.

$$C0+k/2 \leq A0+P1/2 \times j \tag{1}$$

The variable j1, thus determined, is the number of the block which is one of the first to ninth blocks B1-B9 shown in FIG. 5, which contains the coordinates of the FOV at least partially, and which is located at the same coordinates as that end of the FOV farther from the reference point (the end will be hereinafter referred to as "farther end"). In the example shown in FIG. 5, variable j1 is determined as "7." This variable j1 shows that the seventh block B7 is a block which contains the coordinates of the FOV at least partially (the range indicated by the coordinates will be referred to as "FOV range") and which is located at the same coordinates as the farther end. It should be noted that the first to ninth blocks (B1 to B9) are determined by partitioning the region in units of P1/2 from the end of element coil 21-1.

In step Sa4, the main controller 17 determines the maximal value of j that satisfies the formula (2) below and substitutes the maximal value for variable j2.

$$C0-k/2 \geq A0+P1/2 \times j \tag{2}$$

The variable j2, thus determined, is the number of a block which is completely outside the FOV range, and which is located closer to the reference point than the "closer end" of the FOV range. The "closer end" being the end that is closer to the reference point than the "farther end" described above.

In the example shown in FIG. 5, variable j2 is determined as "1", which means that only the first block B1 is outside the FOV range.

In step Sa5, the main controller 17 confirms whether the value of "j1-j2" is odd. The value of "j1-j2" corresponds to the number of blocks at least part of which is located inside the FOV range. When the value of "j1-j2" is even, the FOV can be covered by using element coils, which are ½ of the value of "j1-j2." In this case, the main controller 17 advances from step Sa5 to step Sa6 so as to confirm whether variable j1 is odd. Let us assume that one of element coils 21-1 to 21-4 of coil group G1 and one of element coils 22-1 to 22-4 of coil group G2 are both located at the same coordinate position as the farther end of the FOV. In this case, when variable j1 is even, the former element coil includes a smaller portion that is projected out of the FOV range than the latter element coil does. When variable j1 is odd, the latter element coil includes a smaller portion that is projected out of the FOV range than the former element coil does. Unless variable j1 is odd, the main controller 17 advances from step Sa6 to step Sa9. If variable j1 is odd, the main controller 17 advances from step Sa6 to step Sa11.

Assuming that the value of "j1-j2" is odd, the main controller 17 advances from step Sa5 to step Sa7. In step Sa7, the main controller 17 compares amount L1 (in which the block located at the same coordinate position as the farther end is outside the FOV range) with amount L2 (in which the block located at the same coordinate position as the closer end is outside the FOV range). L1 and L2 are calculated by the following formulas (3) and (4):

$$L1=(A0+P1/2\times j1)-(C0+k/2) \quad (3)$$

$$L2=(C0-k/2)-(A0+P1/2\times j2) \quad (4)$$

When L1 is smaller than L2, it is desirable to use an element coil including a small area that is outside the FOV range, from among the element coils located at the same coordinate position as the farther end. Thus, the main controller 17 advances from step Sa7 to step Sa6 so as to execute the processing described above.

When L1 is not smaler than L2, it is desirable to use an element coil including a small area that is outside the FOV range, from among the element coils located at the same coordinate position as the closer end. Thus, the main controller 17 advances from step Sa7 to step Sa8 so as to confirm whether variable j1 is odd. If variable j1 is odd, the main controller 17 advances from step Sa8 to step Sa9. If variable j1 is not odd, the main controller 17 advances from step Sa8 to step Sa11.

Where the control advances to step Sa9 from either step Sa6 or step Sa8, the main controller 17 selects the first mode. And in step Sa10, the main controller 17 selects an effective channel on the basis of the first setting table shown in FIG. 6.

Where the control advances to step Sa11 from either step Sa6 or step Sa8, the main controller 17 selects the second mode. And in step Sa10, the main controller 17 selects an effective channel on the basis of the second setting table shown in FIG. 7.

In the example shown in FIG. 5, j1 is "7" and j2 is "1". Since the value of "j1-j2" is even and j1 is odd, the main controller 17 selects the second mode. On the basis of the second setting table shown in FIG. 7, channels ch1-ch3 are selected as effective channels. As a result, element coil 22-1 to 22-3 are made effective. If the first mode is selected in the example shown in FIG. 5, the FOV range cannot be covered unless element coils 21-1 to 21-4 are made effective. As can be seen from this, it is obvious that the selection described above is proper.

As described above, the present embodiment automatically selects a coil group and element coils in consideration of the positional relationships between each element coil and the FOV and in such a manner that the portion of a selected element coil which is outside the FOV is minimal. Thanks to this feature, magnetic resonance signals can be acquired, with the sensitivity kept at the lowest possible level with respect to regions other than the FOV.

Second Embodiment

Figure 8:
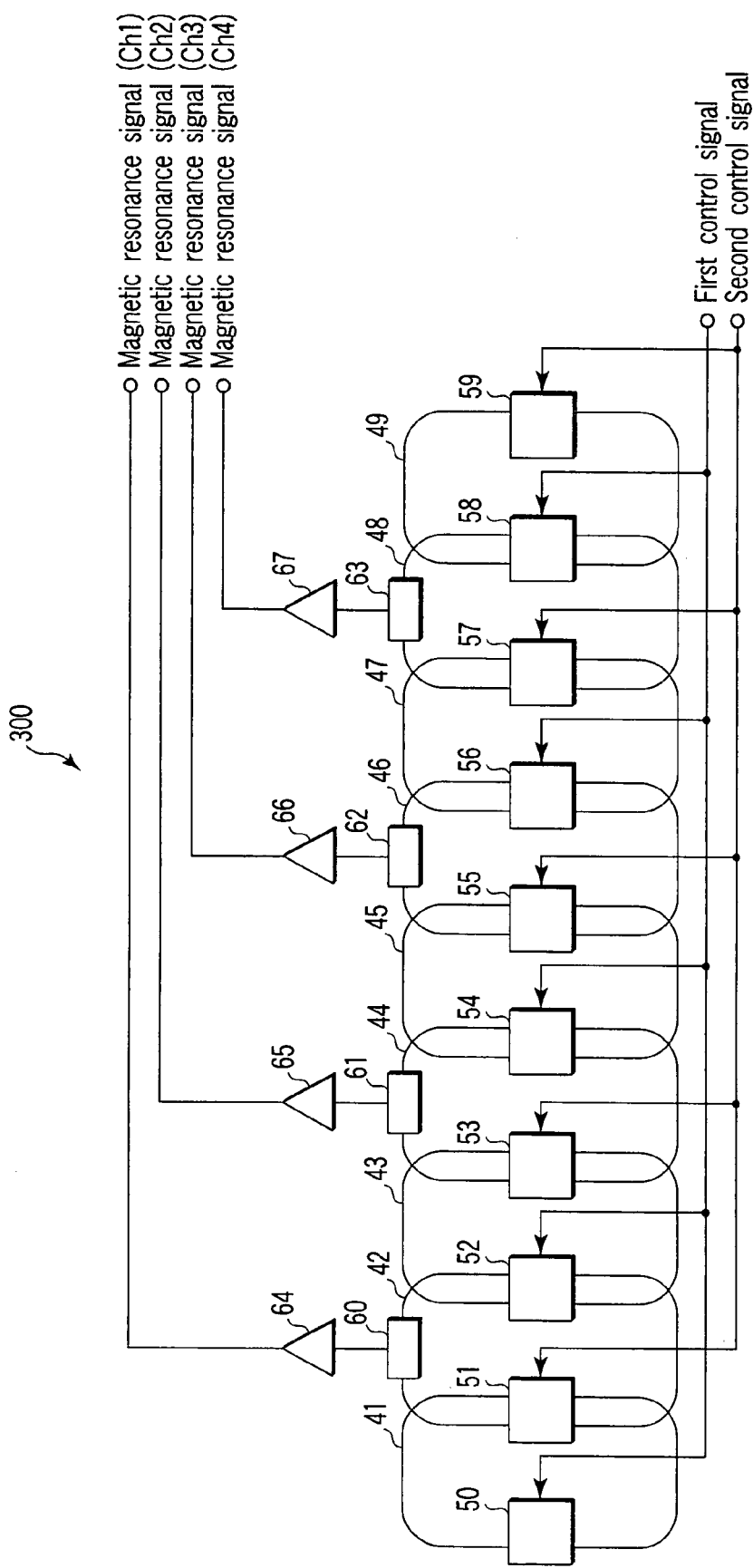
FIG. 8 is a circuit diagram of an array coil used in the second embodiment.

FIG. 8 shows an array coil 300 used in the second embodiment.

This array coil 300 contains conductive elements 41-49, switch circuits 50-59, matching circuits 60-63, and preamplifiers 64-67.

The conductive elements 41-49, each of which is in the form of a loop, are arranged in a line and at the constant intervals. The adjacent conductive elements overlap each other.

Each of the switch circuits 51-58 is located between the adjacent ones of the conductive elements 41-49. Switch circuits 50 and 59 are provided for conductive elements 41 and 49, respectively. Based on the first and second control signals, switch circuits 51-58 connect the two adjacent conductive elements to each other or disconnect them from each other. The first control signal is supplied to switch circuits 50, 52, 54, 56 and 58 and the second control signal is supplied to switch circuits 51, 53, 55, 57 and 59.

Matching circuits 60, 61, 62 and 63 are provided for conductive elements 42, 44, 46 and 48, respectively. The matching circuits 60-63 perform impedance matching between the element coils (which are formed in the manner described later) and the preamplifiers 64-67 by means of the conductive elements 42, 44, 46 and 48 and the conductive element adjacent thereto.

The preamplifiers 64-67 receive output signals of the matching circuits 60-63 and amplify the signals. The outputs of the preamplifiers 64-67 are supplied to the selecting circuit 8 as magnetic resonance signals of the first to fourth channels ch1 to ch4.

Figure 9:
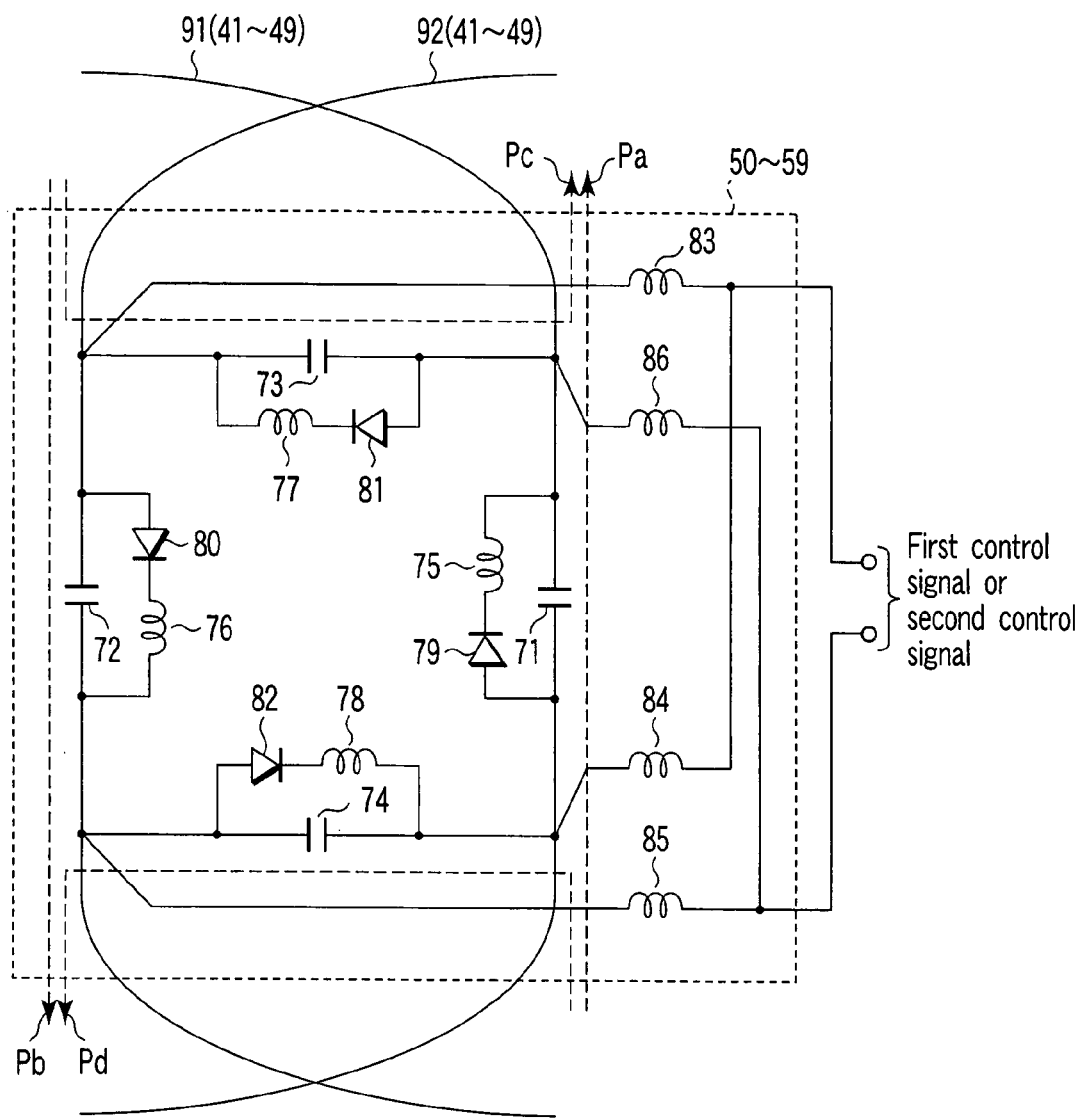
FIG. 9 is a circuit diagram illustrating a detailed configuration of the switch circuit shown in FIG. 8.

FIG. 9 is a circuit diagram showing a detailed configuration of each of the switch circuits 50-59. Since the switch circuits 50-59 have the same circuit configuration, FIG. 9 shows the configuration of only one of them. Although the conductive elements connected or disconnected by the switch circuits 50-59 are different, they will be referred to here as the first and second conductive elements 91 and 92, for the sake of simplicity. In other words, the first conductive element 91 collectively represents the conductive elements 41-48 connected or disconnected by the switch circuits 51-58. Likewise, the second conductive element 92 collectively represents the conductive elements 42-49 connected or disconnected by the switch circuits 51-58. In switch circuit 50, conductive element 41 corresponds to the second conductive element 92, but no conductive element corresponds to the first conductive element 91. In switch circuit 59, conductive element 49 corresponds to the first conductive element 91, but no conductive element corresponds to the second conductive element 92.

As shown in FIG. 9, switch circuits 50-59 contain capacitors 71-74, coils 75-78, PIN diodes 79-82, and choke coils 83-86, respectively.

Capacitor 71 is inserted in the first conductive element 91. One end of coil 75 and the cathode of PIN diode 79 are connected to capacitor 71. Coil 75 and PIN diode 79 are in parallel with capacitor 71.

Capacitor 72 is inserted in the second conductive element 92. One end of coil 76 and the cathode of PIN diode 80 are connected to capacitor 72. Coil 76 and PIN diode 80 are in parallel with capacitor 72.

Capacitors 73 and 74 are inserted between the first conductive element 91 and the second conductive element 92. Capacitor 71 is located between the node at which capacitor 73 is connected to the first conductive element 91 and the node at which capacitor 74 is connected to the first conductive element 91. Likewise, capacitor 72 is located between the node at which capacitor 73 is connected to the second conductive element 92 and the node at which capacitor 74 is connected to the second conductive element 92. One end of coil 77 and the cathode of PIN diode 81 are connected together. Coil 77 and PIN diode 81 are connected in parallel with capacitor 73. One end of coil 78 and the cathode of PIN diode 82 are connected together. Coil 78 and PIN diode 82 are connected in parallel with capacitor 74.

When one of the PIN diodes is ON, a closed loop is formed by (i) a coil connected to the cathode of the PIN diode and (ii) a capacitor connected in parallel with the PIN diode and the coil. The inductance of the coil and the capacitance of the capacitor are determined in such a manner that the closed loop resonates at the frequency of magnetic resonance signals.

One end of choke coil 83 is connected to the node at which capacitor 73 is connected to the second conductive element 92. One end of choke coil 84 is connected to the node at which capacitor 74 is connected to the first conductive element 91. One end of choke coil 85 is connected to the node at which capacitor 74 is connected to the second conductive element 92. One end of choke coil 86 is connected to the node at which capacitor 73 is connected to the first conductive element 91. Other end of choke coil 83 is connected to other end of choke coil 84. Other end of choke coil 85 is connected to other end of choke coil 86.

The computer system 10 applies a control signal between the node between the choke coils 83, 84 and the node between the choke coils 85, 86. The computer system 10 grounds the signal line connected to choke coils 85 and 86. In addition, the computer system 10 controls the potential of the signal line connected to choke coils 83 and 84 to be positive or negative, thereby supplying positive bias or negative bias to array coil 300 as the control signal. This control signal serves as a first control signal in switch circuits 50, 52, 54, 56 and 58, and serves as a second control signal in switch circuits 51, 53, 55, 57 and 59.

A description will now be given as to how the array coil having the above configuration operates.

The computer system 10 outputs a positive bias as one of the first and second control signals, and outputs a negative bias as the other control signal. To be more specific, in the first mode, the main controller 17 controls the interface 11 in such a manner that a positive bias is output as the first control signal and a negative bias is output as the second control signal. In the second mode, the main controller 17 controls the interface 11 in such a manner that a negative bias is output as the first control signal and a positive bias is output as the second control signal.

When a positive bias is input as the first or second control signal, PIN diodes 79 and 80 are applied with a forward bias, and PIN diodes 81 and 82 are applied with a reverse bias. As a result, PIN diodes 79 and 80 are turned on, and PIN diodes 81 and 82 are turned off. Since signals can flow along paths Pc and Pd shown in FIG. 9, the first and second conductive elements 91 and 92 are connected to each other.

On the other hand, when a negative bias is input as the first or second control signal, PIN diodes 79 and 80 are applied with a reverse bias, and PIN diodes 81 and 82 are applied with a forward bias. As a result, PIN diodes 79 and 80 are turned off, and PIN diodes 81 and 82 are turned on. Since signals can flow along paths Pa and Pb shown in FIG. 9, the first and second conductive elements 91 and 92 are disconnected from each other.

Figure 10:
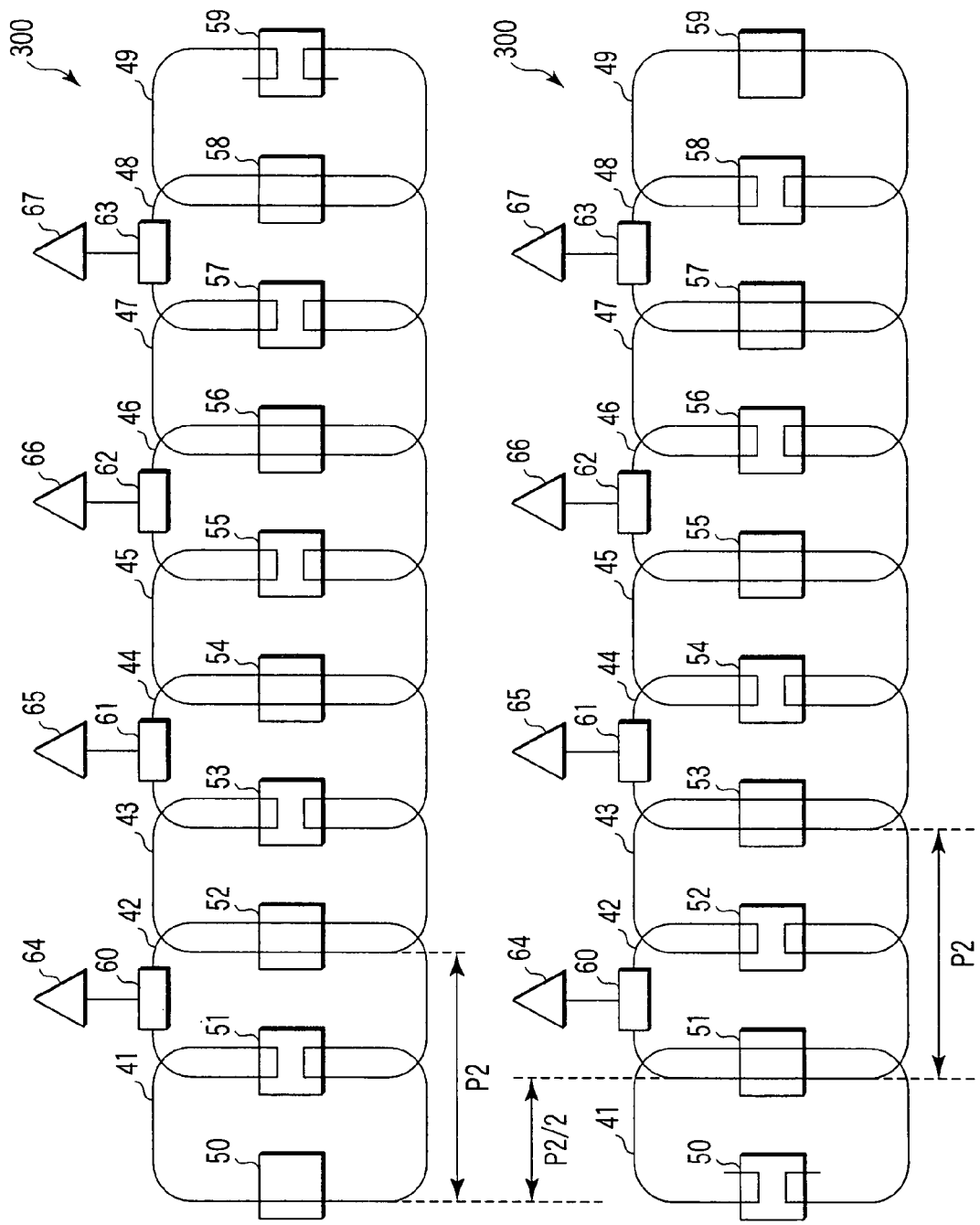
FIG. 10 illustrates how the array coil of the second embodiment operates.

As shown in FIG. 10, in the second mode, switch circuits 51, 53, 55 and 57 connect the adjacent conductive element to each other, and switch circuits 52, 54, 56 and 58 disconnect the adjacent conductive elements from each other. That is, conductive elements 41 and 42 are connected together, conductive elements 43 and 44 are connected together, conductive elements 45 and 46 are connected together, and conductive elements 47 and 48 are connected together. The magnetic resonance signal received by conductive elements 41 and 42, that received by conductive elements 43 and 44, that received by conductive elements 45 and 46, and that received by conductive elements 47,and 48, are supplied to the selecting circuit 8 after passing through matching circuits 60, 61, 62 and 63 and preamplifiers 64, 65, 66 and 67, respectively. As can be seen from this, conductive elements 41 and 42 serve as the element coil of the first channel, conductive elements 45 and 46 serve as the element coil of the second channel, conductive elements 43 and 44 serve as the element coil of the third channel, and conductive elements 47 and 48 serve as the element coil of the fourth channel.

As shown in FIG. 10, in the first mode, switch circuits 51, 53, 55 and 57 disconnect the adjacent conductive element from each other, and switch circuits 52, 54, 56 and 58 connect the adjacent conductive elements from each other. That is, conductive elements 42 and 43 are connected together, conductive elements 44 and 45 are connected together, conductive elements 46 and 47 are connected together, and conductive elements 48 and 49 are connected together. The magnetic resonance signal received by conductive elements 42 and 43, that received by conductive elements 44 and 45, that received by conductive elements 46 and 47, and that received by conductive elements 48 and 49, are supplied to the selecting circuit 8 after passing through matching circuits 60, 61, 62 and 63 and preamplifiers 64, 65, 66 and 67, respectively. As can be seen from this, conductive elements 42 and 43 serve as the element coil of the first channel, conductive elements 44 and 45 serve as the element coil of the second channel, conductive elements 46 and 47 serve as the element coil of the third channel, and conductive elements 48 and 49 serve as the element coil of the fourth channel.

The intervals at which the element coils are arranged in the arrangement direction thereof (i.e., in the direction in which conductive elements 41-49 are arranged) are the same irrespective of the control signal being supplied (the first or second control signal), as indicated by P2 in FIG. 10. The element coils of the same channel are shifted by one half of P2 (=P2/2) between the time when the first control signal is input and the time when the second control signal is input. That is, the position of the actual sensitivity region can be varied by a distance shorter than the intervals at which the element coils are arranged.

The user can select either the first mode or the second mode. In addition, the user can also select which channel should be made effective, from among the four channels through which magnetic resonance signals are supplied. In this case, the main controller 17 selects the mode which the user designates by operating the input unit 16. Further, the main controller 17 controls the selecting circuit 8 to select magnetic resonance signals of the effective channel which the user designates by use of the input unit 16. It should be noted, however, that the main controller 17 can select a mode and an effective channel automatically, as in the first embodiment, though "P2" is used in place of "P1" in formulas (1)-(4) in the second embodiment.

The first and second embodiments described above can be modified in various ways, as will be described below.

In the first embodiment, the number of element coils included in each of coil groups G1 and G2 may be an arbitrary number greater than one.

In the first embodiment, the number of coil groups may be three or more. Assuming that the number of coil groups is p, the distance by which the two element coils of the same coil group are shifted from each other should desirably be 1/p. However, this is not an indispensable requirement to the present invention, and the distance by which the coil groups should be shifted can be determined in an arbitral manner.

In the first embodiment, each coil group may be a combination of element coils arranged in two dimensions.

In the second embodiment, the number of channels may be an arbitrary number greater than one.

In the second embodiment, each element coil may be made of three or more conductive elements that are connected together.

In the second embodiment, the conductive elements 41 and 49 located at the ends do not have to be disconnected. In other words, switch circuits 50 and 59 can be omitted, if so desired.

Figure 11:
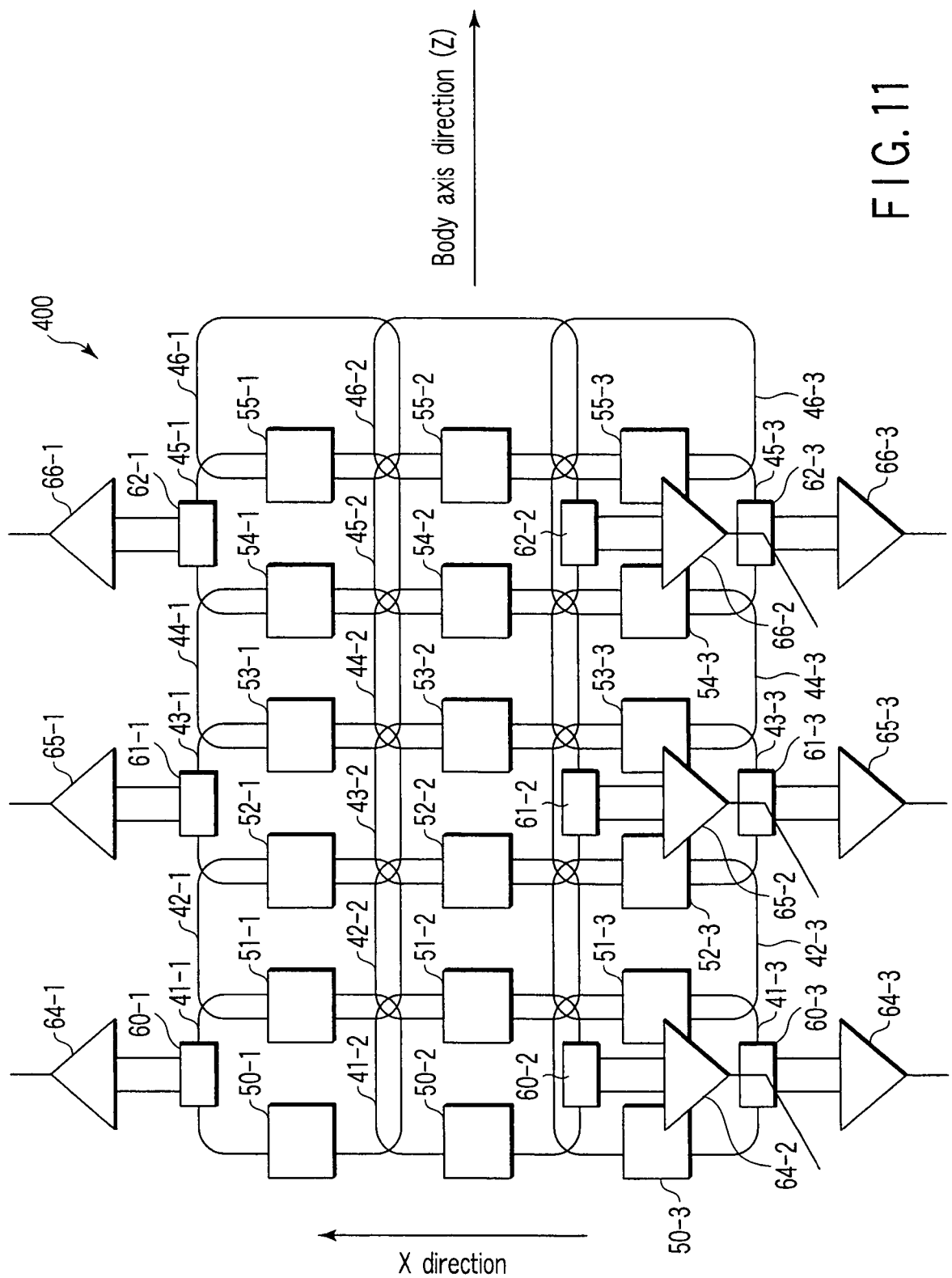
FIG. 11 shows an example of a configuration of a two-dimensional array coil.

A two-dimensional array coil can be provided by arranging two or more sets of an internal structure of the array coils 200 and 300 shown in connection with the first and second embodiments. FIG. 11 shows the configuration of a two-dimensional array coil 400 obtained by arranging three sets of the internal structure of the array coil 300 of the second embodiment. In FIG. 11, the elements corresponding to those shown in FIG. 8 are represented by reference numerals including the suffixes "-1", "-2" and "-3". The elements denoted by the same suffix ("-1", "-2" or "-3") belong to the same group.

In the two-dimensional array coil 400, the direction in which the element coils of one group are arranged is the same as the direction in which the element coils of another group are arranged. To be more specific, the arrangement direction of element coils 41-1, 42-1, 43-1, . . . the arrangement direction of element coils 41-2, 42-2, 43-2, . . . and the arrangement direction of element coils 41-3, 42-3, 43-3, . . . are the same. In general, this direction is the body axis direction of the subject 100 (i.e., the Z axis direction).

The direction in which the element coils of different groups are arranged is perpendicular to the direction in which the element coils of the same group are arranged. To be more specific, the arrangement direction of element coils 41-1, 41-2, 41-3 are perpendicular to the arrangement direction of coils 41-3, 42-3, 43-3, . . . . In general, this direction is the X axis direction.

With respect to each of the groups, a mode and an effective channel may be selected in the same manner as in the second embodiment. In normal use, however, it is desirable that the mode and effective channel selected for one group be the same as the mode and effective channel selected for another group.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An MRI RF array coil having a controllably variable field of view (FOV) size and/or location, said coil comprising:
    at least three conductive elements arranged at predetermined intervals, each of the conductive elements being in the form of a loop; and
    a plurality of switches that enable the conductive elements to be connected to a receiver in different subsets according to a plurality of connecting patterns, in each of which the conductive elements define a respectively corresponding different FOV region, the plurality of switches changing the size and/or location of FOV region of the coil by selecting one of the connecting patterns.

2. The array coil according to claim 1, wherein
    said at least three conductive elements include adjacent conductive elements that define loops which overlap each other, and
    the plurality of switches are arranged at a position where the adjacent conductive elements overlap each other, and which switch the adjacent conductive elements between a connected state and a disconnected state.

3. The array coil according to claim 2, further comprising:
    two further switches which are connected to switch each of two conductive elements located at end positions between a connected state and a disconnected state.

4. The array coil according to claim 1, wherein said at least three conductive elements are odd in number,
    the connecting patterns include a pattern in which the odd-numbered conductive elements are connected in units of two from a first end position of the odd numbered conductive elements, and a pattern in which the odd-numbered conductive elements are connected in units of two from a second end position which is opposite to the first end position.

5. An MRI RF array coil as in claim 1, wherein said plurality of switches change the location of FOV without changing the size of FOV.

6. An MRI RF array coil having a controllably variable field of view (FOV) size and/or location, said coil comprising:
    n conductive elements, wherein one element coil is formed by connecting m of the n conductive elements to a receiver, m being an integer greater than one, and n being an integer greater than m; and
    a unit configured to connect the conductive elements to a receiver in different subsets according to one of a plurality of connecting patterns, in each of which the conductive elements define a respectively corresponding different FOV region, at least one switch changing the size and/or location of FOV region of the coil by selecting one of the connecting patterns, each of the connecting patterns being determined such that at least one element coil is formed.

7. An MRI RF array coil as in claim 6, wherein said at least one switch changes the location of FOV without changing the size of FOV.

8. A magnetic resonance imaging apparatus comprising:
    an MRI RF array coil having a controllably variable field of view (FOV) size and/or location, said coil including (i) at least three conductive elements arranged at predetermined intervals, each of the conductive elements being in the form of a loop; and (ii) a plurality of switches that enable the conductive elements to be connected to a receiver in different subsets according to a plurality of connecting patterns, in each of which the conductive elements define a respectively corresponding different FOV region, the plurality of switches changing the size and/or location of FOV region of the coil by selecting one of the connecting patterns;
a pattern selecting unit configured to select one of the connecting patterns;
a control unit configured to control the plurality of switches such that the conductive elements are connected to a receiver according to a connecting pattern selected by the pattern selecting unit; and
a reconstruction unit configured to reconstruct an image of a subject on the basis of signals which a conductive element group outputs in response to magnetic resonance signals radiating from a subject, the conductive element group being constituted by those conductive elements which are connected to a receiver according to the connecting pattern selected by the pattern selecting unit.

9. The magnetic resonance imaging apparatus according to claim 8, wherein
said at least three conductive elements include adjacent conductive elements that define loops which overlap each other, and
the plurality of switches are arranged at a position where the adjacent conductive elements overlap each other, and which switch the adjacent conductive elements between a connected state and a disconnected state with respect to a receiver.

10. The magnetic resonance imaging apparatus according to claim 9, further comprising:
two further switches which are connected to switch each of two conductive elements located at end positions between a connected state and a disconnected state.

11. The magnetic resonance imaging apparatus according to claim 8, wherein
said at least three conductive elements are odd in number, and
the connecting patterns include a pattern in which the odd-numbered conductive elements are connected in units of two from a first end position of the odd-numbered conductive elements, and a pattern in which the odd-numbered conductive elements are connected in units of two from a second end position which is opposite to the first end position.

12. The magnetic resonance imaging apparatus according to claim 8,
wherein the pattern selecting unit selects one of the connecting patterns on the basis of positional relationships between an imaging region and said at least three conductive elements.

13. The magnetic resonance imaging apparatus according to claim 12, wherein the pattern selecting unit selects one of the connecting patterns that enables magnetic resonance signals supplied from all areas of the imaging region to be received by use of a number of the conductive elements less than the total number of conductive elements.

14. The magnetic resonance imaging apparatus according to claim 8, further comprising:
a signal selecting unit configured to select at least part of the magnetic resonance signals, which are output from the conductive element group connected to a receiver according to the connecting pattern selected by the pattern selecting unit, on the basis of positional relationships between an imaging region and said at least three conductive elements,
the reconstruction unit reconstructing the image on the basis of the magnetic resonance signals selected by the signal selecting unit.

15. The magnetic resonance imaging apparatus according to claim 14, wherein the signal selecting unit selects magnetic resonance signals which are smaller in number than the magnetic resonance signals supplied from all said conductive elements.

16. A magnetic resonance imaging apparatus as in claim 8, wherein said plurality of switches change the location of FOV without changing the size of FOV.

17. A magnetic resonance imaging apparatus comprising:
an RF array coil having a controllably variable field of view (FOV) size and/or location, said coil including (i) n conductive elements, wherein one element coil is formed by arranging m of the n conductive elements, m being an integer greater than one, and n being an integer greater than m, and a connecting unit configured to connect the conductive elements according to one of a plurality of connecting patterns, in each of which the conductive elements define a respectively corresponding different FOV region, at least one switch changing the size and/or location of FOV region of the coil by selecting one of the connecting patterns, each of the connecting patterns being determined such that at least one element coil is formed; and
a reconstruction unit configured to reconstruct an image of a subject on the basis of signals which at least one element coil outputs in response to magnetic resonance signals radiating from the subject, said at least one element coil being included among the element coils of coil groups formed by connecting the m conductive elements.

18. The magnetic resonance imaging apparatus according to claim 17, wherein the connecting unit selects one of the connecting patterns on the basis of positional relationships between an imaging region and at least three conductive elements, and connects the conductive elements to a receiver according to the selected connecting pattern.

19. The magnetic resonance imaging apparatus according to claim 18, wherein the pattern is selected such that the magnetic resonance imaging signals supplied from all areas of an imaging region are received by using a number of the element coils that is less than the total number of element coils.

20. The magnetic resonance imaging apparatus according to claim 17, further comprising:
a signal selecting unit configured to select at least part of the magnetic resonance signals, which are output from the element coils, on the basis of positional relationships between an imaging region and the n conductive elements,
the reconstruction unit reconstructing the image on the basis of the magnetic resonance signals selected by the signal selecting unit.

21. The magnetic resonance imaging apparatus according to claim 20, wherein the signal selecting unit selects magnetic resonance signals which are smaller in number than the magnetic resonance signals supplied from all element coils.

22. A magnetic resonance imaging apparatus as in claim 17, wherein said at least one switch changes the location of FOV without changing the size of FOV.

\* \* \* \* \*